United States Patent
Schulz et al.

(12)
(10) Patent No.: US 6,672,901 B2
(45) Date of Patent: Jan. 6, 2004

(54) HOUSING FOR PLUG-CONNECTED ELECTRICAL COMPONENT AND METHOD OF MOUNTING SUCH A HOUSING ON A PRINTED CIRCUIT BOARD

(75) Inventors: Klaus Schulz, Berlin (DE); Andreas Stockhaus, Berin (DE)

(73) Assignee: Infineon Technologies AG, Munich (DE)

( * ) Notice: Subject to any disclaimer, the term of this patent is extended or adjusted under 35 U.S.C. 154(b) by 136 days.

(21) Appl. No.: 09/761,597

(22) Filed: Jan. 16, 2001

(65) Prior Publication Data

US 2002/0094721 A1 Jul. 18, 2002

(30) Foreign Application Priority Data

Jan. 15, 2001 (DE) .......................... 101 02 459

(51) Int. Cl.⁷ ............................. H01R 13/648
(52) U.S. Cl. ...................... 439/607; 439/567
(58) Field of Search ............... 439/607–610, 439/567, 571, 572

(56) References Cited

U.S. PATENT DOCUMENTS 5,080,611 A * 1/1992 Hypes .................. 439/567
5,967,846 A * 10/1999 Davis et al. ............. 439/609
6,416,361 B1 * 7/2002 Hwang .................. 439/607
6,419,523 B1 * 7/2002 Jones et al. ............. 439/607

FOREIGN PATENT DOCUMENTS

DE 93 10 630.0 U1 11/1993
WO WO 99/46968 9/1999

* cited by examiner

*Primary Examiner*—Khiem Nguyen
(74) *Attorney, Agent, or Firm*—Laurence A. Greenberg; Werner H. Stemer; Ralph E. Locher

(57) ABSTRACT

A connector for a plug-connected electrical component, in particular, an optoelectronic transceiver, includes a package having fastening pins for fastening the package on a printed-circuit board, the fastening pins to be connected to the board in a press-fit. Preferably, the fastening pins are U-shaped and have two resilient legs able to move toward each other. Each of the two legs has external serrations, particularly, barbs. The package is a one-part package and has a clearance on a bottom side for accommodating a plug, already fastened to the board, when the package is connected to the board. The package couples the component to the board. Also provided is a method of mounting the package by first soldering the plug for the electronic component to the board and testing the plug. Then, the package is fitted onto the board accommodating the plug with the fastening pins connected to the board in a press-fit.

17 Claims, 3 Drawing Sheets

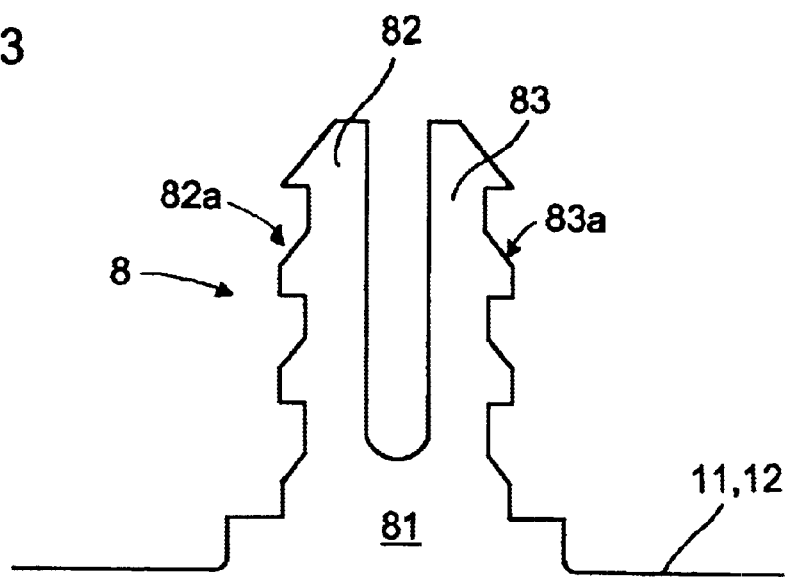
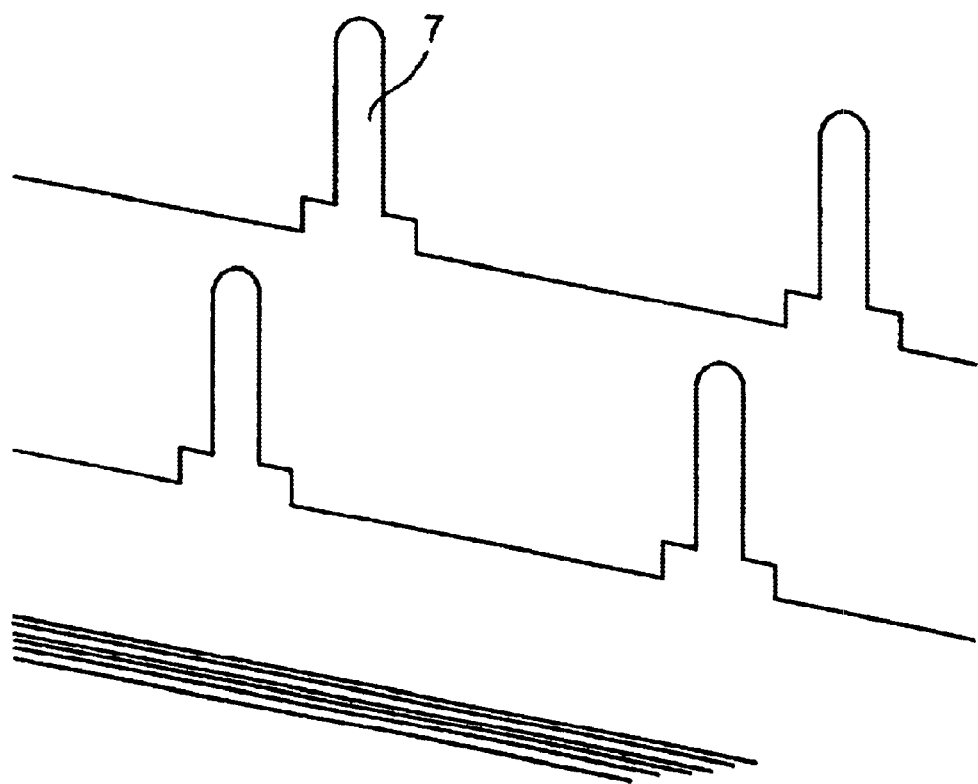

HOUSING FOR PLUG-CONNECTED ELECTRICAL COMPONENT AND METHOD OF MOUNTING SUCH A HOUSING ON A PRINTED CIRCUIT BOARD

BACKGROUND OF THE INVENTION

Field of the Invention

The invention relates to a package for an electrical component which can be connected to the package in a pluggable manner, in particular for an optoelectronic transceiver, the package having fastening pins for its fastening on a printed-circuit board, characterized in that the fastening pins can be connected to the printed-circuit board, thereby forming a press-fit connection, and to a method of mounting a package of this type on a printed-circuit board.

It is known to arrange optoelectronic transceivers on a printed-circuit board and connect them to an optical network by means of optical plug-in connectors. Known in particular are so-called small-form-factor-pluggable (SFP) transceivers of a small type, which are of a pluggable design (so-called "detachable transceivers") and can be plugged into a receptacle of a package mounted onto the printed-circuit board.

A corresponding metallic package 1 is represented in FIG. 4. The package comprises an upper part (top cage) 22 and a lower part (bottom cage) 21, which can be connected to each other in an engageable manner and form a receiving package into which a transceiver can be plugged or from which a transceiver can be unplugged in the direction of the double-headed arrow A-B. At the same time, the package 1 preferably serves as a shielding plate for the electromagnetic shielding of the pluggable transceiver.

The lower part 21 of the package is fastened on a printed-circuit board 3. Both parts of the package 21, 22 protrude through a cutout in a metallic rear wall (not represented), which is electrically connected to the package via contact springs 11. Also mounted within the package and directly on the printed-circuit board 3 is an electrical plug 4, by means of which the plugged-in transceiver can be connected to the printed-circuit board 3 and into which the transceiver is inserted during plugging into the package 1. As represented in the detail in FIG. 5, fastening pins 7 (also referred to as fastening legs or soldering pins) are formed on the underside of the lower part 21 of the package, are inserted into corresponding openings 31 in the printed-circuit board 3 and serve for the fastening of the package to the printed-circuit board 3.

The package 1 is attached to the printed-circuit board 3 by, firstly, the lower part 21 of the package and the electrical plug 4 being inserted into the printed-circuit board 3 and by, subsequently, the two being soldered. After the electrical plug 4 has been soldered, it is checked for defects and reworked if necessary. Subsequently, the upper part 22 of the package is fitted onto the lower part 21 of the package.

The package known in the prior art has the disadvantage that, on account of the mounting of the lower part at the same time as the electrical plug, relatively large openings have to be formed in the lower part of the package to allow subsequent testing of the electrical plug for defects to be ensured.

SUMMARY OF THE INVENTION

The present invention is based on the object of providing a package for a component which can be connected to the package in a pluggable manner and a method of mounting a package of this type on a printed-circuit board which make simple and inexpensive mounting possible with a simple design of the package.

This object is achieved according to the invention by a package for an electrical component which can be connected to the package in a pluggable manner, in particular for an optoelectronic transceiver, the package having fastening pins for its fastening on a printed-circuit board, characterized in that the fastening pins can be connected to the printed-circuit board, thereby forming a press-fit connection, and a method of mounting a package according to claim 1 on a printed-circuit board, characterized by the steps of soldering an electrical plug to the printed-circuit board, subsequently fitting the package onto the printed-circuit board, the fastening pins of the package being connected to the printed-circuit board, with a press-fit connection thereby being formed, and the fitted-on package receiving the plug. Preferred and advantageous developments of the invention are specified in the subclaims.

Accordingly, the package according to the invention is characterized in that the fastening pins which serve for the fastening of the package on the printed-circuit board can be connected to the printed-circuit board, thereby forming a press-fit connection. In particular, the fastening pins clasp in corresponding drill holes in the printed-circuit board. On account of the press-fit connection, a separate soldering operation is not necessary for connecting the fastening pins to the printed-circuit board. As a result, the mounting of the package on the printed-circuit board is simplified considerably.

A press-fit connection is understood here to mean any connection which establishes a connection between the pins and the printed-circuit board just by inserting the fastening pins into corresponding openings in the printed-circuit board, without any need for further mounting steps such as soldering or adhesive bonding. Press-fit connections may be both positive connections and non-positive connections. A press-fit connection is also referred to as a snug fit or press fit.

The use of a press-fit connection makes it possible to solder the electrical plug to the printed-circuit board even before the package is fastened to the printed-circuit board and subsequently test it for defects and carry out any necessary reworking. Since, at this stage, the package or the lower part of the package has not yet been mounted, the electrical plug is easily accessible. The package is only mounted after testing and any reworking of the plug have been carried out, with the result that there is no need to provide the package with openings for allowing such checking and reworking. It is consequently possible for the package not to require corresponding openings or for them to be made smaller, so that the overall electromagnetic shielding effect is increased.

Correspondingly, the method according to the invention provides that, firstly, the plug for the optoelectronic component is soldered to the printed-circuit board and only after that is the package fitted onto the plug, the fastening pins of the package being inserted into drill holes in the printed-circuit board, with a press-fit connection thereby being formed, and the fitted-on package receiving the plug. The package is, as it were, plugged into the printed-circuit board via the plug.

In a preferred development of the invention, the fastening pins have a serration which clasps in the corresponding drill holes in a printed-circuit board. In this case, the fastening pins are advantageously of a U-shaped design, the two legs of the fastening pin respectively having an external serration and being able to move toward each other. The serration advantageously forms barbs which prevent the fastening pins inserted into the printed-circuit board from being able to be pulled out of the printed-circuit board again.

It is pointed out, however, that it is within the scope of the invention to realize any desired press-fit connections by means of the fastening pins. Similarly, the fastening pins may, for example, be designed in a star-shaped form or as hooks. The only decisive criterion is that of satisfying the function of realizing a press-fit connection with the printed-circuit board.

Apart from the mechanical fastening of a printed-circuit board, the fastening pins are also used for making electrical contact with a reference potential. For this purpose, the drill holes in the printed-circuit board have an inner metallic coating which is connected to GROUND, with the result that the metallic fastening pins are likewise connected to this potential and tie the package to this potential.

In the preferred development of the invention, the package is of a one-part design. It has in this case a clearance on its bottom side in such a way that the package can be fitted onto the electrical plug which has already been connected to the printed-circuit board and couples the component to be inserted to the printed-circuit board. The clearance may in this case cover the entire bottom, i.e. the package may be designed essentially without a bottom part.

A one-part package is distinguished by the fact that, in comparison with a two-part package, it is mechanically more stable and can also be mounted automatically. In addition, the electromagnetic shielding effect is improved, since there is no slit along the connecting line between an upper part of the package and a lower part of the package. Furthermore, there is no need for a mounting step to attach the upper part of the package on the lower part of the package, which in the case of the prior art represents a certain problem since it cannot be automated.

Once the electrical plug has been fastened on the printed-circuit board and tested, the package of a one-part design is fitted onto the printed-circuit board and connected to it by means of the press-fit serration of the fastening pins in one step, without further soldering operations or the attachment of an upper part of the package being required. In this way, extremely simple and effective mounting of the package is made possible.

BRIEF DESCRIPTION OF THE DRAWINGS

The invention is explained in more detail below on the basis of an exemplary embodiment with reference to the figures of the drawing, in which:

FIG. 3 shows a view of a detail of the fastening pins of FIGS. 1, 2, provided with a serration;

FIG. 5 shows fastening pins according to the prior art.

DESCRIPTION OF THE PREFERRED EMBODIMENT

Figure 4:
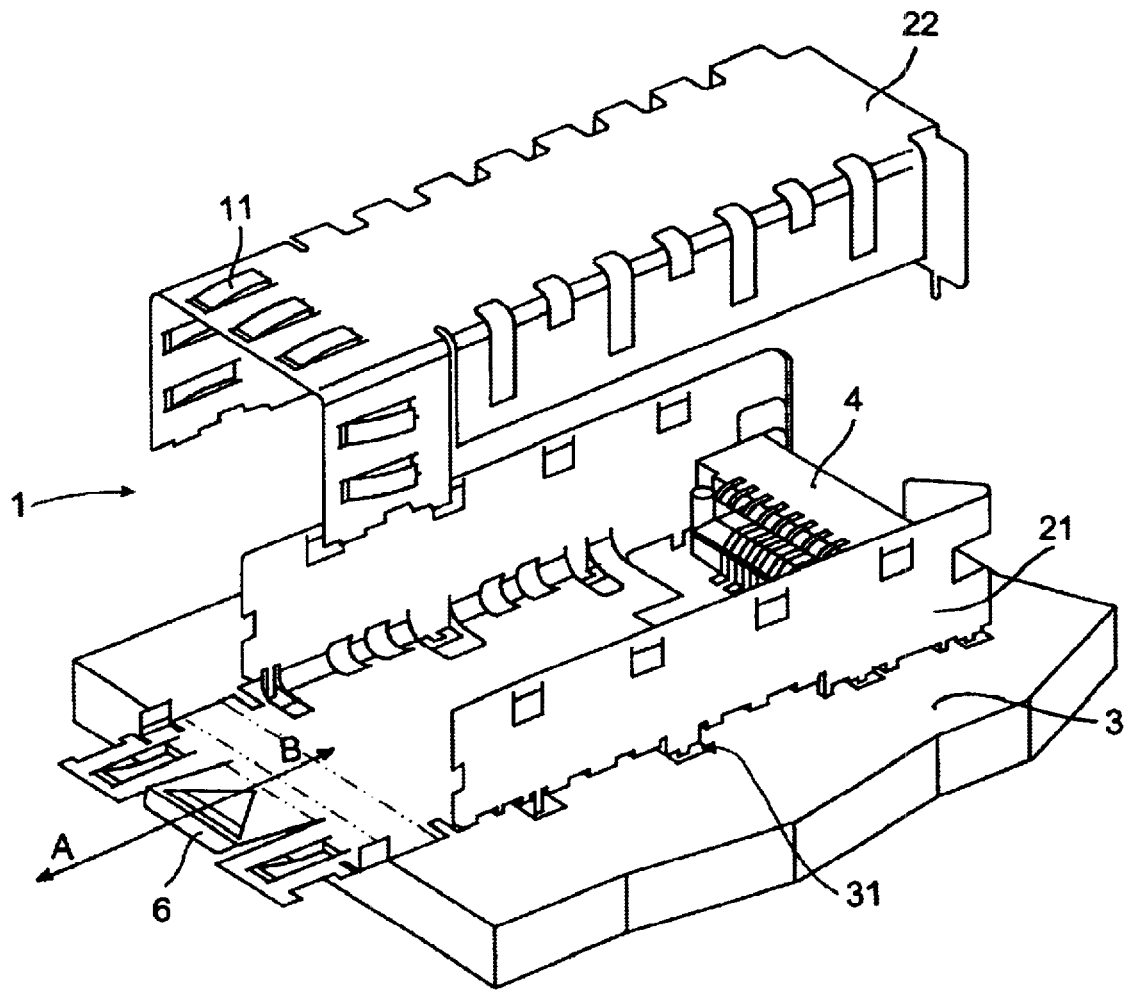
FIG. 4 shows a package according to the prior art.

A package for receiving an optoelectronic transceiver and its fastening on a printed-circuit board were explained at the beginning on the basis of FIGS. 4 and 5.

Figure 1:
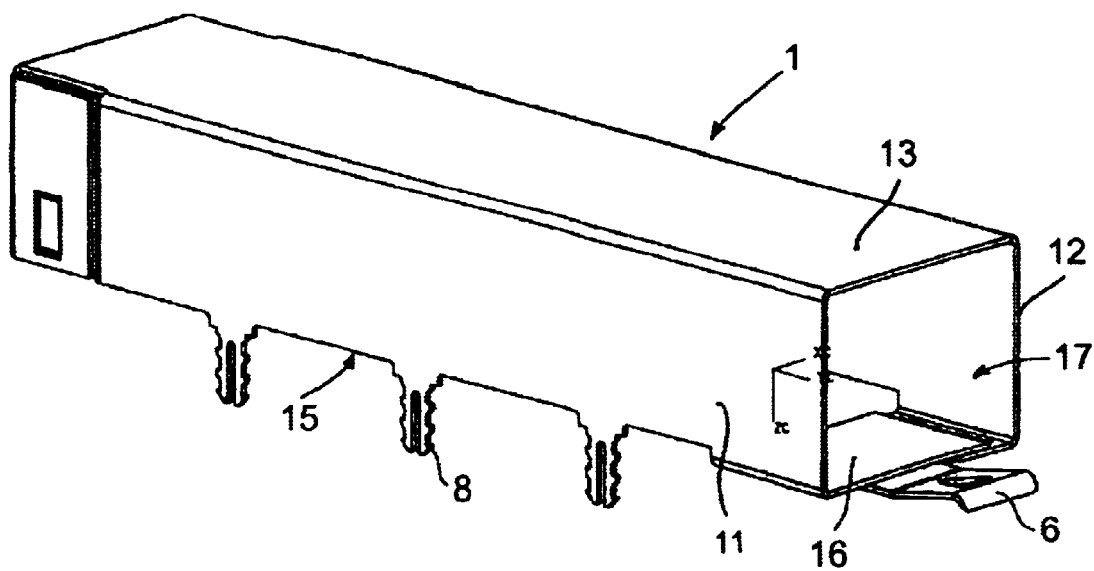
FIG. 1 shows a perspective view of a one-part package according to the invention obliquely from above.
Figure 2:
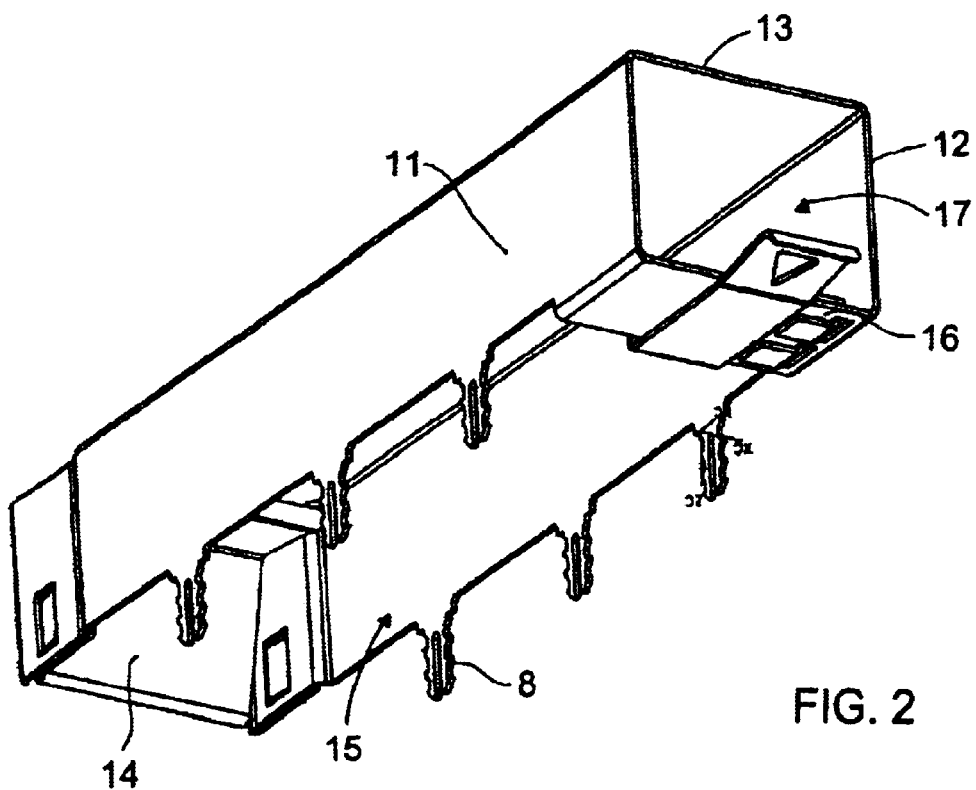
FIG. 2 shows a perspective view of the package of FIG. 1 obliquely from below.

According to FIGS. 1 and 2, the package 1 is of a one-part design and has two side walls 11, 12, an upper wall 13, a rear wall 14 and a bottom region 15. The bottom region 15 of the package is formed essentially free of material, with the result that the package 1 is U-shaped in cross section. Only in the receiving region for the transceiver is a peripheral shielding plate 16 formed. Alternatively, according to FIG. 4, a clearance is provided in the bottom region. At least such a clearance is required, however, to allow an electrical plug to be fastened on the printed-circuit board in a way corresponding to the plug 4 of FIG. 4.

An electrooptical transceiver (not represented) can be inserted into the package 1 via the front, open region 17 of the package. The transceiver has an electrooptical component such as a laser diode and/or a receiving diode, the associated electrical driver circuits or postamplification circuits and, at its rearward region in the plugging direction, a plug receptacle for the coupling on of an optical plug. Transceivers of this type are known per se in the prior art, so are not dealt with any further.

Formed on the underside of the side walls 11, 12 of the one-part package 1 are fastening pins 8, which are represented in the detail in FIG. 3. The fastening pins 8 are connected to the printed-circuit board, thereby forming a press-fit connection. Any desired press-fit connections can be used here for connecting the package to the printed-circuit board 3.

In the embodiment of FIG. 3, the fastening pins 8 have a special configuration to the extent that they are of a U-shaped design, the middle cross-piece 81 being integrally formed onto the lower edge of the package. The two side legs 82, 83 are spaced apart from each other, so that when the fastening pin 8 is inserted into the drill hole in a printed-circuit board they are pressed together and thereby produce a radial spring force in the outward direction.

The two legs 82, 83 have in each case an external serration 82a, 83a, which is made in the form of barbs. When the fastening pin 8 is inserted into a drill hole in the printed-circuit board, the two legs 82, 83 are pressed resiliently together and the serration 82a, 83a wedges itself in the corresponding drill holes on account of the barbs and the spring force of the pressed-together legs 82, 83. A press-fit connection is provided in this way.

The fastening of the package 1 on a printed-circuit board 3 then takes place by the electrical plug 4 (cf. FIG. 4) firstly being soldered on the printed-circuit board and subsequently tested and reworked. After completion of the soldering operation and testing of the plug, the one-part package 1 is fitted onto the printed-circuit board in a single mounting process, the fastening pins of the package engaging into corresponding drill holes 31 in the printed-circuit board 3, with a press fit or a press-fit connection thereby being formed (cf. FIG. 4). The package fitted onto the printed-circuit board 3 receives the premounted plug 4 or other components premounted on the printed-circuit board.

The fastening pins 8 are additionally used for connecting the package 1 to GROUND. For this purpose, the drill holes in the printed-circuit board 3 for receiving the fastening pins 8 are coated in a conducting manner, for example platinum-plated, on their inner side and this coating in the printed-circuit board is connected to GROUND. The metallic pins 8 are consequently also used to tie the package 1 to GROUND. The package is preferably also connected to GROUND via contact springs in the region of the peripheral shielding plate 16 (cf. FIG. 4), which bear against a metallic rear wall.

The one-part design of the package 1 provides good shielding from interfering radiation produced inside the package.

The invention is not restricted in its execution to the exemplary embodiments represented above. For example, it is likewise within the scope of the invention to connect the lower part of a two-part package according to FIG. 4 to a printed-circuit board via a press-fit connection. All that is essential for the invention is that the fastening pins of a package for receiving an electrical component are able to be connected to a printed-circuit board via a press-fit connection.

We claim:

1. In combination with a printed-circuit board to be connected to a reference potential, a connector for a plug-connected electrical component, comprising:

a package having fastening pins for fastening said package on the printed-circuit board, said fastening pins to be inserted into boles in the printed-circuit board in a press-fit and to electrically connect said package to the reference potential at conductive inner sides of the holes in the printed-circuit board.

2. The connector according to claim 1, wherein said fastening pins have serrations to act on the conductive inner sides of the holes.

3. The connector according to claim 2, wherein:

said fastening pins are U-shaped and have two resilient legs able to move toward each other; and each of said two legs has at least one external serration.

4. The connector according to claim 3, wherein said at least one external serration is at least one barb.

5. The connector according to claim 3, wherein each of said two legs has external serrations.

6. The package according to claim 1, wherein said package is a one-part package.

7. The package according to claim 6, wherein said package has:

a bottom side;

a clearance on said bottom side for accommodating a plug, already fastened to the printed-circuit board, when said package is connected to the printed circuit board; and said package coupling a component to the printed-circuit board.

8. In combination with a printed-circuit board to be connected to a reference potential, a connector for a plug-connected electrical component, comprising:

a one-part package having:

a bottom side;

fastening pins for fastening said one-part package on the printed-circuit board having a plug, said fastening pins to be inserted into holes in the printed-circuit board in a press-fit and to electrically connect said package to the reference potential at conductive inner sides of the holes in the printed-circuit board;

a clearance on said bottom side accommodating the plug when said one-part package is connected to the printed circuit board; and said one-part package coupling a component to the printed-circuit board through the plug.

9. In combination with a printed-circuit board to be connected to a reference potential, a connector for a plug-connected optoelectronic transceiver, comprising:

a package having fastening pins for fastening said package on the printed-circuit board, said fastening pins to be inserted into holes in the printed-circuit board in a press-fit and to electrically connect said package to the reference potential at conductive inner sides of the holes in the printed-circuit board.

10. In combination with a printed-circuit board to be connected to a reference potential, a connector for a plug-connected optoelectronic transceiver, comprising:

a one-part package having:

a bottom side;

fastening pins for fastening said one-part package on the printed-circuit board having a plug, said fastening pins to be inserted into holes in the printed-circuit board in a press-fit and to electrically connect said package to the reference potential at conductive inner sides of the holes in the printed-circuit board;

a clearance on said bottom side accommodating the plug when said one-part package is connected to the printed circuit board; and said one-part package coupling an optoelectronic transceiver to the printed-circuit board through the plug.

11. A method of mounting a package on a printed-circuit board, which comprises:

soldering an electrical plug to the printed-circuit board;

providing a package having fastening pins, and subsequently press-fitting the fastening pins of the package into holes formed in the printed-circuit board to electrically connect the package to a reference potential carried on conductive inner sides of the holes with the package accommodating the electrical plug.

12. The method according to claim 11, which further comprises performing the providing step by providing a one-part package having fastening pins.

13. The method according to claim 11, which further comprises testing the soldered electrical plug for functionality before the package is fitted on the printed-circuit board.

14. The method according to claim 11, which further comprises connecting an electrical component to the printed-circuit board through the electrical plug.

15. The method according to claim 14, which further comprises performing the connecting step by plugging the electrical component into the package to connect the electrical component to the printed-circuit board through the electrical plug.

16. The method according to claim 15, wherein the electrical component is an optoelectronic transceiver.

17. A connector assembly, comprising;

a printed-circuit board to be connected to a reference potential and having holes formed therein; and a package having fastening pins for fastening said package on said printed-circuit board, said fastening pins to be inserted into said holes by a press-fit and to electrically connect said package to the reference potential at conductive inner sides of said holes.

* * * * *

UNITED STATES PATENT AND TRADEMARK OFFICE
CERTIFICATE OF CORRECTION

PATENT NO. : 6,672,901 B2
DATED : January 6, 2004
INVENTOR(S) : Klaus Schulz et al.

It is certified that error appears in the above-identified patent and that said Letters Patent is hereby corrected as shown below:

<u>Title page,</u>
Item [75], Inventor, should read as follows:
-- Klaus Schulz, Berlin (DE); Andreas Stockhaus, Berlin (DE) --

Signed and Sealed this

Twenty-third Day of March, 2004

JON W. DUDAS
*Acting Director of the United States Patent and Trademark Office*